(12) United States Patent
Yang

(10) Patent No.: US 7,564,903 B2
(45) Date of Patent: Jul. 21, 2009

(54) METHOD AND APPARATUS FOR MEASURING REFLECTED VOLTAGE OF TRANSFORMER

(75) Inventor: Ta-yung Yang, Milpitas, CA (US)

(73) Assignee: System General Corp., Taipei Hsien (TW)

( * ) Notice: Subject to any disclaimer, the term of this patent is extended or adjusted under 35 U.S.C. 154(b) by 790 days.

(21) Appl. No.: 11/245,650

(22) Filed: Oct. 7, 2005

(65) Prior Publication Data

US 2007/0081599 A1 Apr. 12, 2007

(51) Int. Cl.
*H04B 3/00* (2006.01)

(52) U.S. Cl. .......................... 375/257; 363/16; 363/20; 363/21.18; 363/21.01; 363/21.15

(58) Field of Classification Search .............. 375/257, 375/258, 355; 363/21
See application file for complete search history.

(56) References Cited

U.S. PATENT DOCUMENTS

| | | | | |
|---|---|---|---|---|
| 4,302,803 A | * | 11/1981 | Shelly | ..................... 363/20 |
| 5,841,643 A | * | 11/1998 | Schenkel | .................. 363/21.13 |
| 6,118,675 A | * | 9/2000 | Lionetto et al. | .......... 363/21.13 |
| 6,721,192 B1 | | 4/2004 | Yang et al. | ................ 363/21.18 |
| 6,836,415 B1 | | 12/2004 | Yang et al. | ................ 363/21.01 |
| 6,853,563 B1 | | 2/2005 | Yang et al. | ................ 363/21.15 |
| 6,862,194 B2 | | 3/2005 | Yang et al. | ..................... 363/16 |

* cited by examiner

*Primary Examiner*—Shuwang Liu
*Assistant Examiner*—Dhaval Patel
(74) *Attorney, Agent, or Firm*—J.C. Patents

(57) ABSTRACT

A method and apparatus of sampling reflected voltage signal of a transformer is proposed. Sampling signals are used for generating hold voltages by sequentially sampling the reflected voltage from the transformer. A buffer circuit generates a buffer signal from the higher voltage of hold voltages. A sampling switch periodically conducts the buffer signal to produce a feedback signal according to an output of the buffer circuit. The feedback signal is proportional to output voltage of the transformer. A threshold signal added by the reflected voltage signal produces a level-shift signal. A discharge-time signal is enabled once the switching signal is disabled. The discharge-time signal is disabled once the level-shift signal is lower than output of the buffer circuit. The pulse width of the discharge-time signal is correlated to the discharge time of the transformer. The sampling signals are enabled to generate hold voltages when discharge-time signal is enabled.

15 Claims, 8 Drawing Sheets

METHOD AND APPARATUS FOR MEASURING REFLECTED VOLTAGE OF TRANSFORMER

BACKGROUND OF THE INVENTION

1. Field of the Invention

The present invention relates to a control circuit for a power converter, and more specifically relates to a switching control circuit for a switching mode power converter.

2. Description of Related Art

Power converters have been widely used to provide regulated output voltages. For safety purposes, an off-line power converter must provide galvanic isolation between its primary side and secondary side. An optical-coupler and a secondary-side regulator are needed to regulate the output voltage of the off-line power converter. In order to reduce the device counts and to exclude a feedback circuit from a secondary-side of the power converter, a control technology at a primary-side has been disclosed in U.S. Pat. No. 4,302,803 "Rectifier-Converter Power Supply with Multi-Channel Flyback Inverter", by Randolph D. W. Shelly. In recent technology, U.S. Pat. No. 6,721,192 "PWM controller regulating output voltage and output current in primary side", by Yang, et al., U.S. Pat. No. 6,836,415 "Primary-side regulated pulse width modulation controller with improved load regulation", by Yang, et al., U.S. Pat. No. 6,853,563 "Primary-side controlled flyback power converter, by Yang, et al., and U.S. Pat. No. 6,862,194 "Flyback power converter having a constant voltage and a constant current output under primary-side PWM control", by Yang, et al, have been introduced. However, for measuring a signal from the transformer, the foregoing technologies cannot yield accurate result.

The objective of the present invention is to provide a precise sampling circuit for a switching control circuit of a power converter for measuring a reflected voltage signal and a discharge time of a transformer. By using the sampled signal from the transformer, the output of the power converter can be regulated without the optical-coupler and the secondary-side regulator. In addition, the discharge time of the transformer is able to be used for quasi-resonant power converters to synchronize with the valley voltage and to achieve soft switching effect.

SUMMARY OF THE INVENTION

A multi-sampling circuit is coupled to receive a reflected voltage signal from a winding of a transformer. The multi-sampling circuit includes a signal generator developed to receive the switching signal and the reflected voltage signal for generating a discharge-time signal and a plurality of sampling signals. The sampling signals are sequentially generated as the switching signal is disabled. The switching signal is used for switching the transformer via a switch to regulate the output of the transformer. A sample-hold circuit is coupled to receive the sampling signals for sampling the reflected voltage signal. The reflected voltage signal multi-sampled by the sampling signals is stored into hold capacitors respectively. Therefore, hold capacitors generate hold voltages in response to the sampling operation of the sampling signals. A buffer circuit is coupled to the hold capacitors to generate a buffer signal in accordance with the higher voltage of the hold voltages. A comparison circuit is coupled to generate a stop signal by comparing the buffer signal with a level-shift signal. The reflected voltage signal is added with a threshold signal to generate the level-shift signal. The stop signal is enabled once the level-shift signal is lower than the buffer signal.

The discharge-time signal is enabled as the switching signal is disabled. The discharge-time signal is disabled as the stop signal is enabled. The pulse width of the discharge-time signal is thus correlated to the discharge time of the transformer. Besides, a feedback signal is generated in accordance with the buffer signal after the stop signal is generated. The stop signal further determinates the sampling signals. The feedback signal is therefore corrected to an output voltage of the transformer.

It is to be understood that both the foregoing general descriptions and the following detailed descriptions are exemplary, and are intended to provide further explanation of the invention as claimed. Still further objects and advantages will become apparent from a consideration of the ensuing description and drawings.

BRIEF DESCRIPTION OF THE DRAWINGS

The accompanying drawings are included to provide further understanding of the invention, and are incorporated into and constitute a part of this specification. The drawings illustrate embodiments of the invention and, together with the description, serve to explain the principles of the invention.

FIG. 2A shows a signal flow of the switching circuit as a power switch is turned on.

DESCRIPTION OF THE EMBODIMENTS

Figure 1:
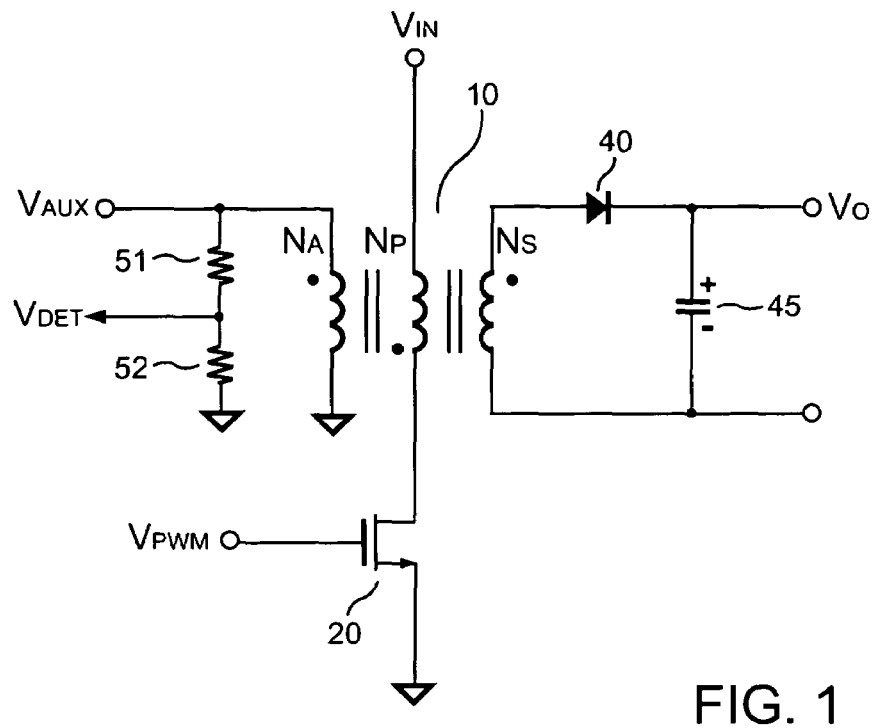
FIG. 1 shows a schematic diagram of a switching circuit.

FIG. 1 shows a switching circuit, including a transformer 10 having an auxiliary winding $N_A$, a primary winding $N_P$, and a secondary winding $N_S$. The primary winding $N_P$ is coupled to an input voltage $V_{IN}$. A voltage divider formed by resistors 51 and 52 is connected to the auxiliary winding $N_A$ for obtaining a reflected voltage signal $V_{DET}$ from a voltage signal $V_{AUX}$ at the auxiliary winding $N_A$. In order to regulate an output voltage $V_O$ and an output current $I_O$ of the switching circuit, a switching signal $V_{PWM}$ switches the transformer 10 via a switch, such as a transistor 20.

Figure 2A:
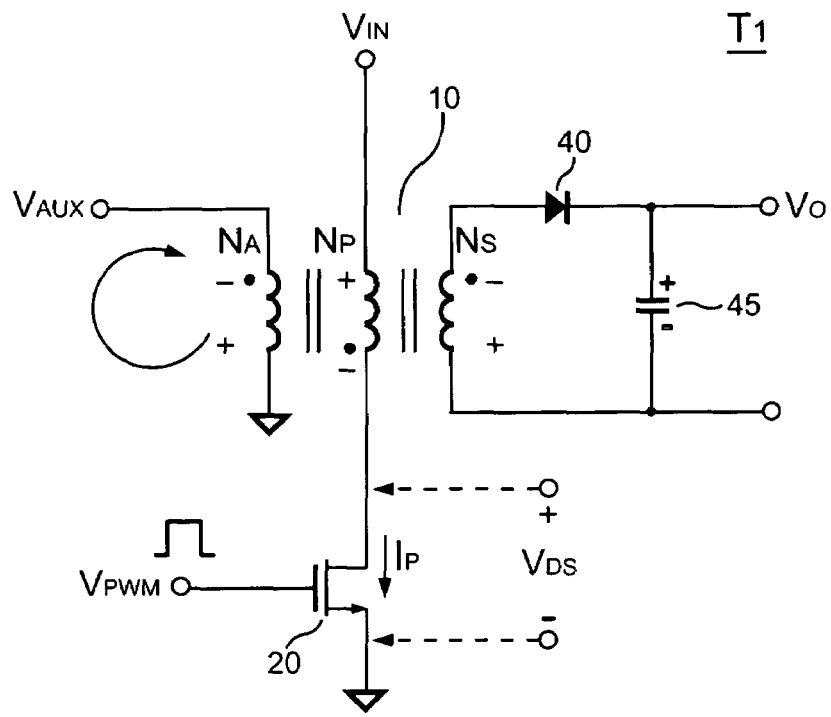

Referring to FIG. 1 and FIG. 2A, when the switching signal $V_{PWM}$ becomes on (logic-high), a primary-side switching current $I_P$ is generated accordingly to store energy into the transformer 10. Various waveforms in the switching circuit in this stage are shown during a period $T_1$ in FIG. 3. A peak value $I_{P1}$ of the primary-side switching current $I_P$ can be given by:

$$I_{P1} = \frac{V_{IN}}{L_P} \times T_{ON} \qquad (1)$$

Where $L_P$ is the inductance of the primary winding $N_P$ of the transformer 10; $T_{ON}$ is an on-time of the switching signal $V_{PWM}$.

Figure 2B:
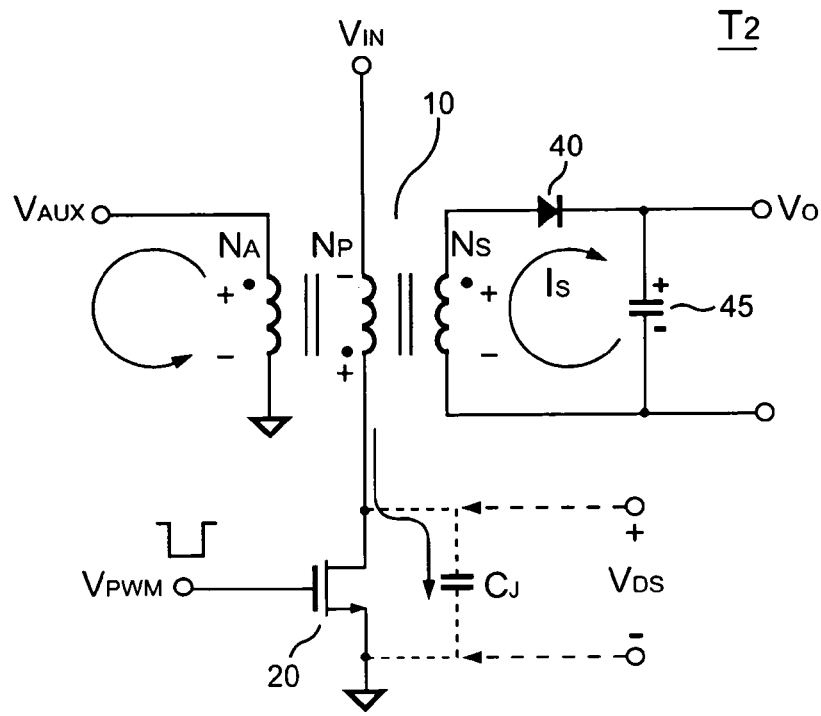
FIG. 2B shows a signal flow of the switching circuit as the power switch is turned off.
Figure 3:
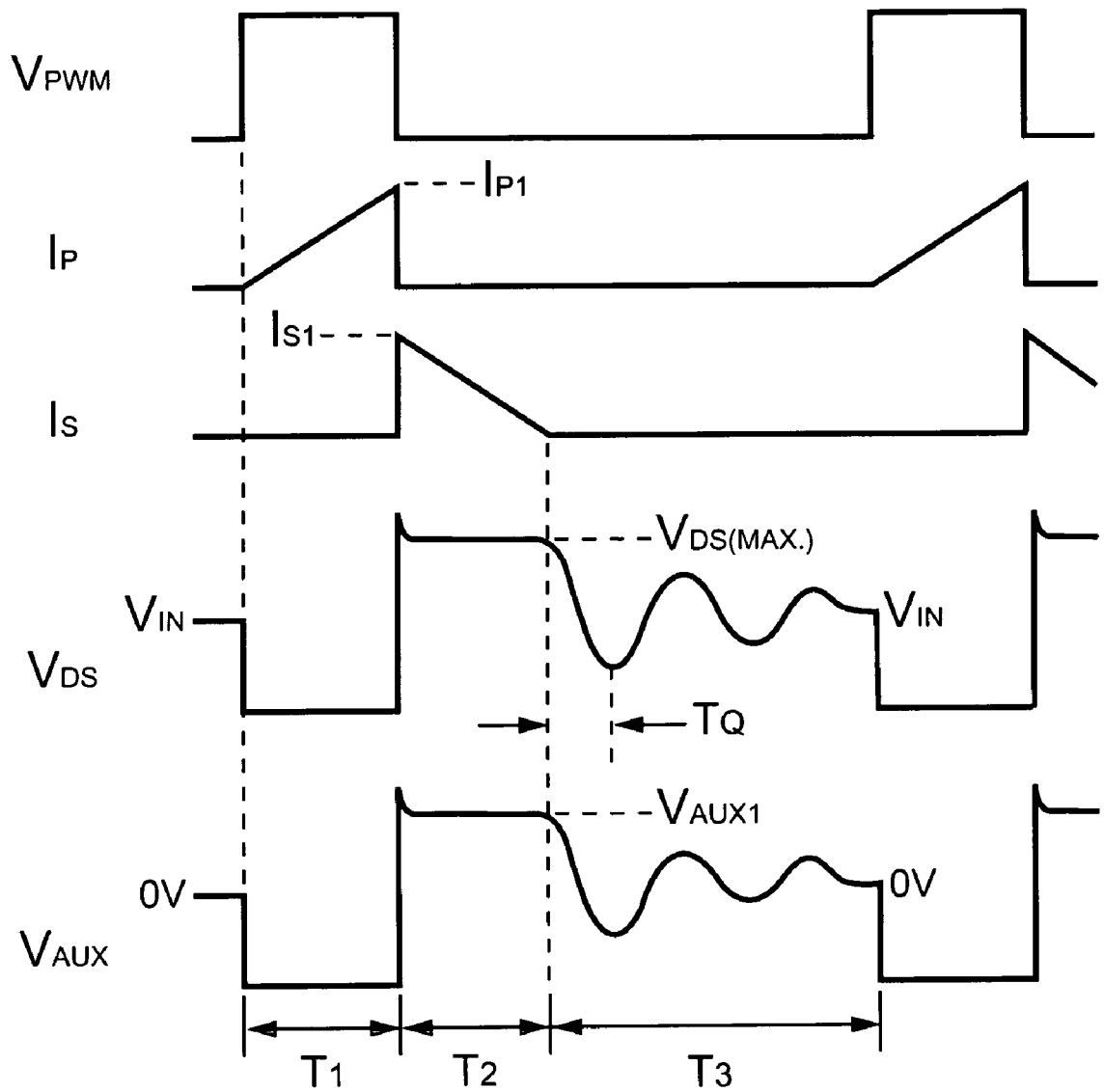
FIG. 3 shows various waveforms of the switching circuit in each switching cycle.

Referring to FIG. 1 and FIG. 2B, when the switching signal $V_{PWM}$ becomes off (logic-low), the energy stored in the transformer 10 is delivered to the secondary side of the transformer 10 and to an output of the switching circuit via a rectifier 40. A secondary-side switching current $I_S$ is generated accordingly. Various waveforms in this stage during a period $T_2$ are also shown in FIG. 3. A peak value $I_{S1}$ of the secondary-side switching current $I_S$ is given by:

$$I_{S1} = \frac{(V_O + V_F)}{L_S} \times T_{DS} \qquad (2)$$

Where $V_O$ is the output voltage of the switching circuit; $V_F$ is a forward voltage drop of the rectifier 40; $L_S$ is the inductance of the secondary winding $N_S$ of the transformer 10; $T_{DS}$ is a discharge time of the transformer 10, which also represents a discharge time of the secondary-side switching current Is.

Meanwhile, the voltage signal $V_{AUX}$ is generated at the auxiliary winding $N_A$ of the transformer 10. A voltage signal $V_{AUX1}$ as shown in FIG. 3 is given by:

$$V_{AUX1} = \frac{T_{NA}}{T_{NS}} \times (V_O + V_F) \qquad (3)$$

Meanwhile, the energy stored in the transformer 10 shall charge a parasitic capacitor $C_J$ of the transistor 20 to generate a voltage $V_{DS}$ across the parasitic capacitor $C_J$ of the transistor 20. The voltage $V_{DS}$ is given by:

$$V_{DS} = V_{IN} + \left[\frac{T_{NP}}{T_{NS}} \times (V_O + V_F)\right] \qquad (4)$$

Where $V_{IN}$ is the input voltage of the switching circuit; $T_{NA}$, $T_{NP}$ and $T_{NS}$ are respectively the winding turns of the auxiliary winding $N_A$, the primary winding $N_P$, and the secondary winding $N_S$ of the transformer 10.

Figure 2C:
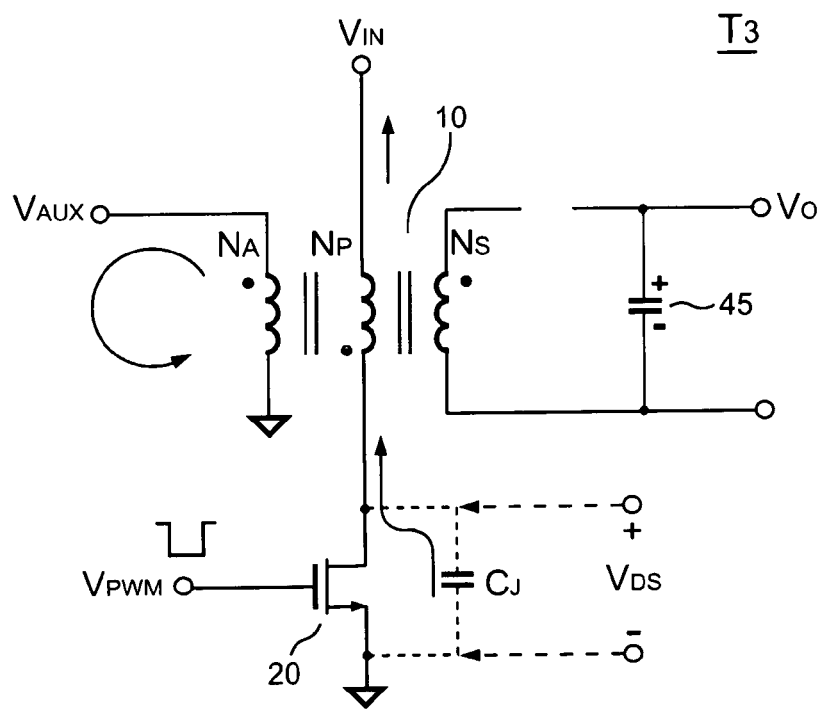
FIG. 2C shows a signal flow of the switching circuit as the power switch is turned off.

Referring to FIG. 1 and FIG. 2C, when the energy stored in the transformer 10 is fully released, the secondary-side switching current $I_S$ falls to zero. In the meantime, since the voltage $V_{DS}$ is higher than the input voltage $V_{IN}$, the voltage $V_{DS}$ starts to charge back to the input voltage $V_{IN}$. Various waveforms in this stage during a period $T_3$ are shown in FIG. 3. The voltage $V_{DS}$ decreases to a valley voltage at the end of a period $T_Q$. The slew-rate decrement of the voltage $V_{DS}$ is determined by a resonant frequency $f_R$. The resonant frequency $f_R$ and the period $T_Q$ are respectively given by equations (5) and (6).

$$f_R = \frac{1}{2\pi\sqrt{L_P \times C_{JJ}}} \qquad (5)$$

$$T_Q = \frac{1}{(4 \times f_R)}$$

$$T_Q = \frac{\pi\sqrt{L_P \times C_{JJ}}}{2} \qquad (6)$$

Where $C_{JJ}$ is the capacitance of the parasitic capacitor $C_J$ of the transistor 20.

The voltage signal $V_{AUX}$ starts to decrease as the voltage $V_{DS}$ starts to fall. The voltage signal $V_{AUX}$ is correlated with the voltage $V_{DS}$, which can be given by:

$$V_{AUX} = \frac{T_{NA}}{T_{NP}} \times (V_{DS} - V_{IN}) \qquad (7)$$

Figure 6:
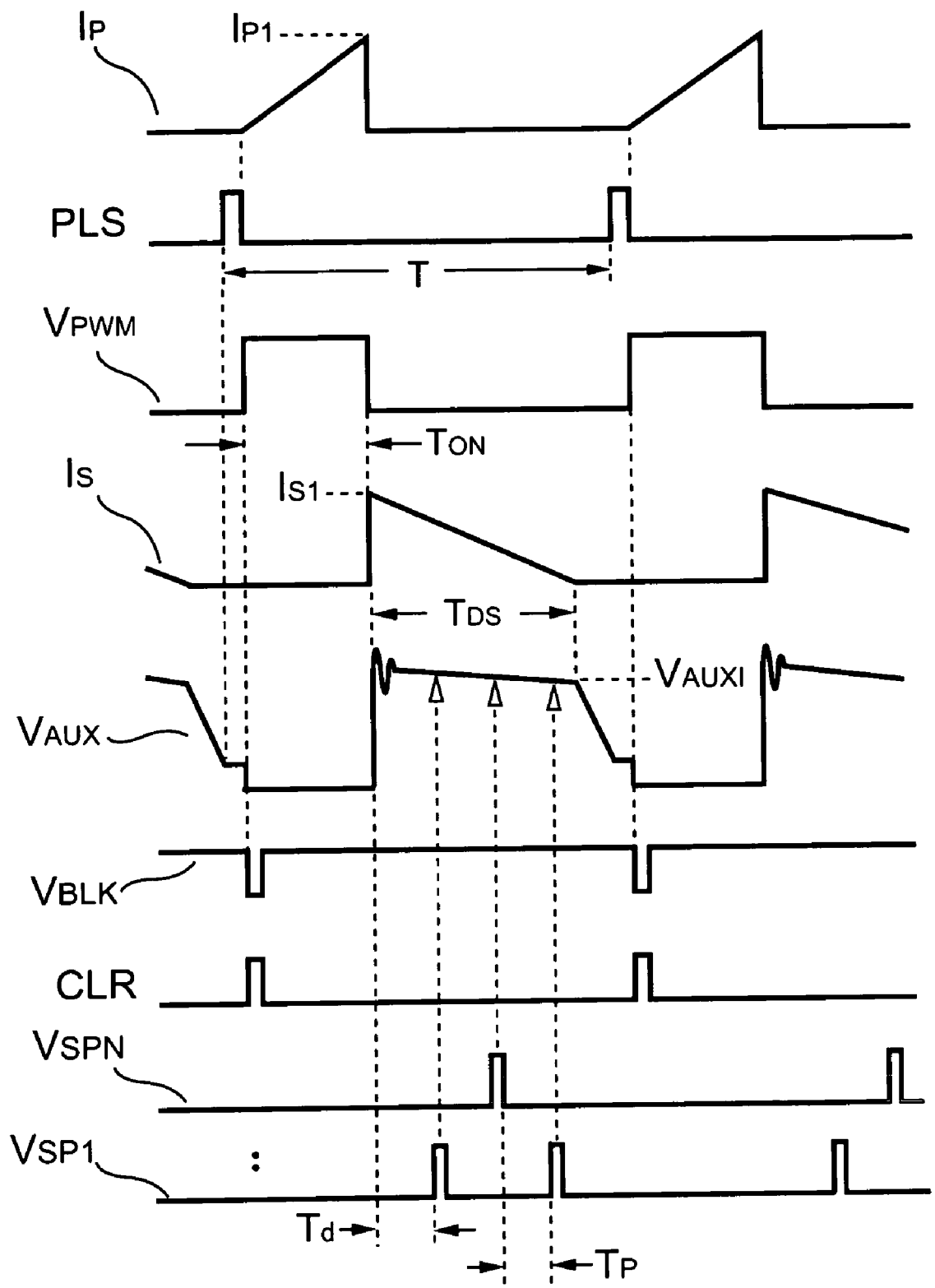
FIG. 6 shows key waveforms of the multi-sampling circuit of the present invention.

Therefore, as shown in FIG. 6, the discharge time $T_{DS}$ in equation (2) can be measured from the falling edge of the switching signal $V_{PWM}$ to the falling corner of the voltage signal $V_{AUX}$.

Referring to FIG. 1, the resistors 51 and 52 form the voltage divider connected between the auxiliary winding $N_A$ of the transformer 10 and a ground reference to generate a reflected voltage signal $V_{DET}$, which is given by:

$$V_{DET} = \frac{R_{52}}{R_{51} + R_{52}} \times V_{AUX} \qquad (8)$$

Where $R_{51}$ and $R_{52}$ are respectively the resistance of the resistors 51 and 52.

Figure 4:
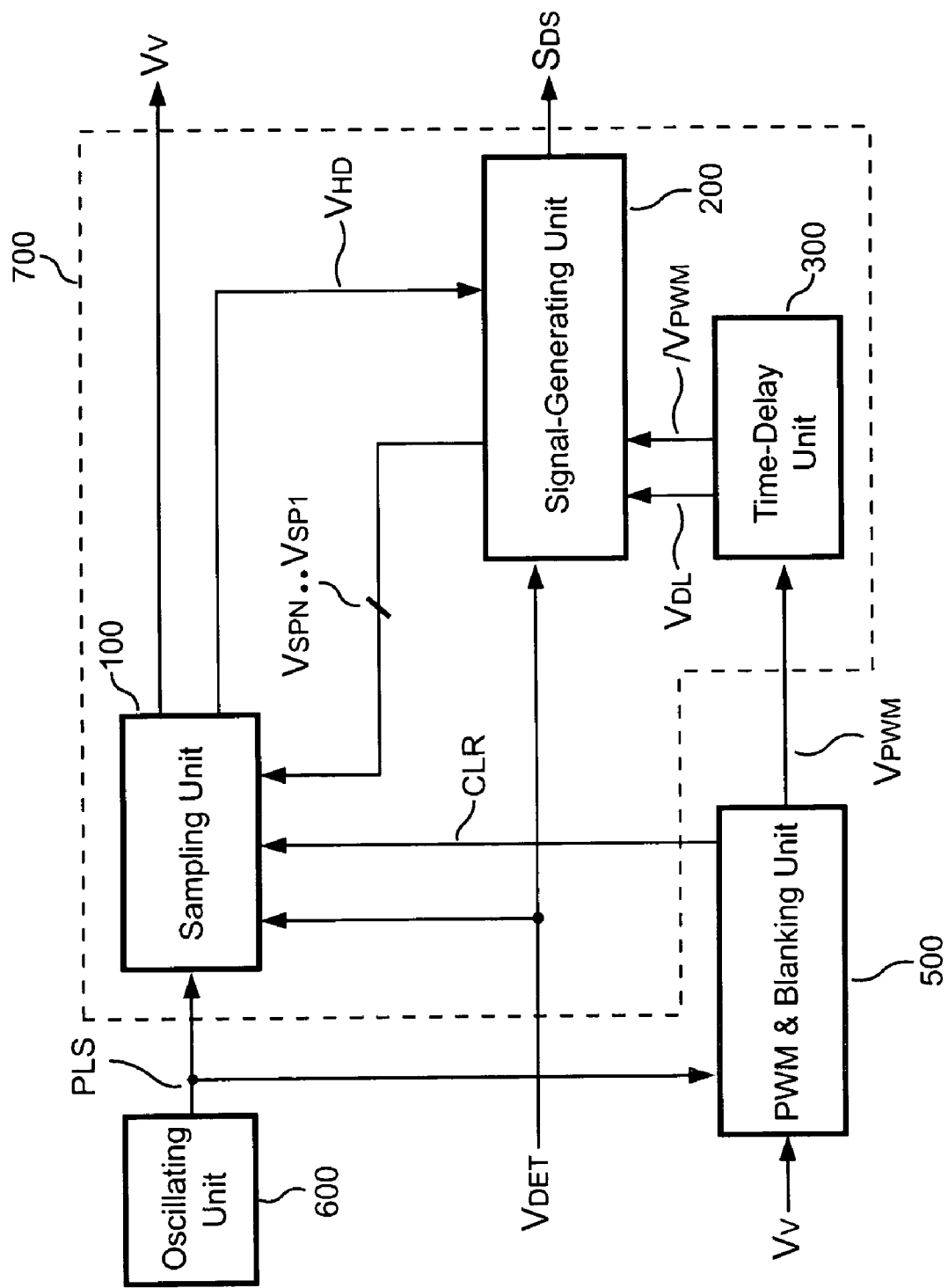
FIG. 4 shows a block diagram of a multi-sampling circuit of the present invention.

FIG. 4 shows a multi-sampling circuit 700 of the present invention. The multi-sampling circuit 700 is connected to a PWM-and-blanking unit 500, an oscillating unit 600, and the auxiliary winding $N_A$ of the transformer 10 via the voltage divider. The multi-sampling circuit 700 includes a sampling unit 100, a signal-generating unit 200, and a time-delay unit 300.

Further referring to FIG. 4, the time-delay unit 300 is connected to the PWM-and-blanking unit 500 for receiving the switching signal $V_{PWM}$. The time-delay unit 300 generates an inverse switching signal $/V_{PWM}$ via an inverter of the time-delay unit 300. The time-delay unit 300 further generates a delay-time signal $V_{DL}$ as the switching signal $V_{PWM}$ is disabled. The signal-generating unit 200 is connected to the time-delay unit 300 for receiving the delay-time signal $V_{DL}$, the inverse switching signal $/V_{PWM}$, and the reflected voltage signal $V_{DET}$. The signal-generating unit 200 generates a discharge-time signal $S_{DS}$, sampling signals $V_{SPN} \ldots V_{SP1}$. The sampling unit 100 is connected to the oscillating unit 600, the PWM-and-blanking unit 500, and the signal-generating unit 200 for receiving sampling signals $V_{SPN} \ldots V_{SP1}$, the reflected voltage signal $V_{DET}$, a pulse signal PLS generated by the oscillating unit 600, and a clear signal CLR generated by the PWM-and-blanking unit 500. Sampling signals $V_{SPN} \ldots V_{SP1}$ sequentially control the sampling unit 100 to sample the reflected voltage signal $V_{DET}$ to generate a buffer signal $V_{HD}$ and a voltage-feedback signal $V_V$.

The main objective of the present invention is to provide a precise sampling circuit for measuring the voltage signal and the discharge time of the transformer. In addition, the present invention is able to regulate the output without having an optical-coupler and a secondary-side regulator.

Figure 5:
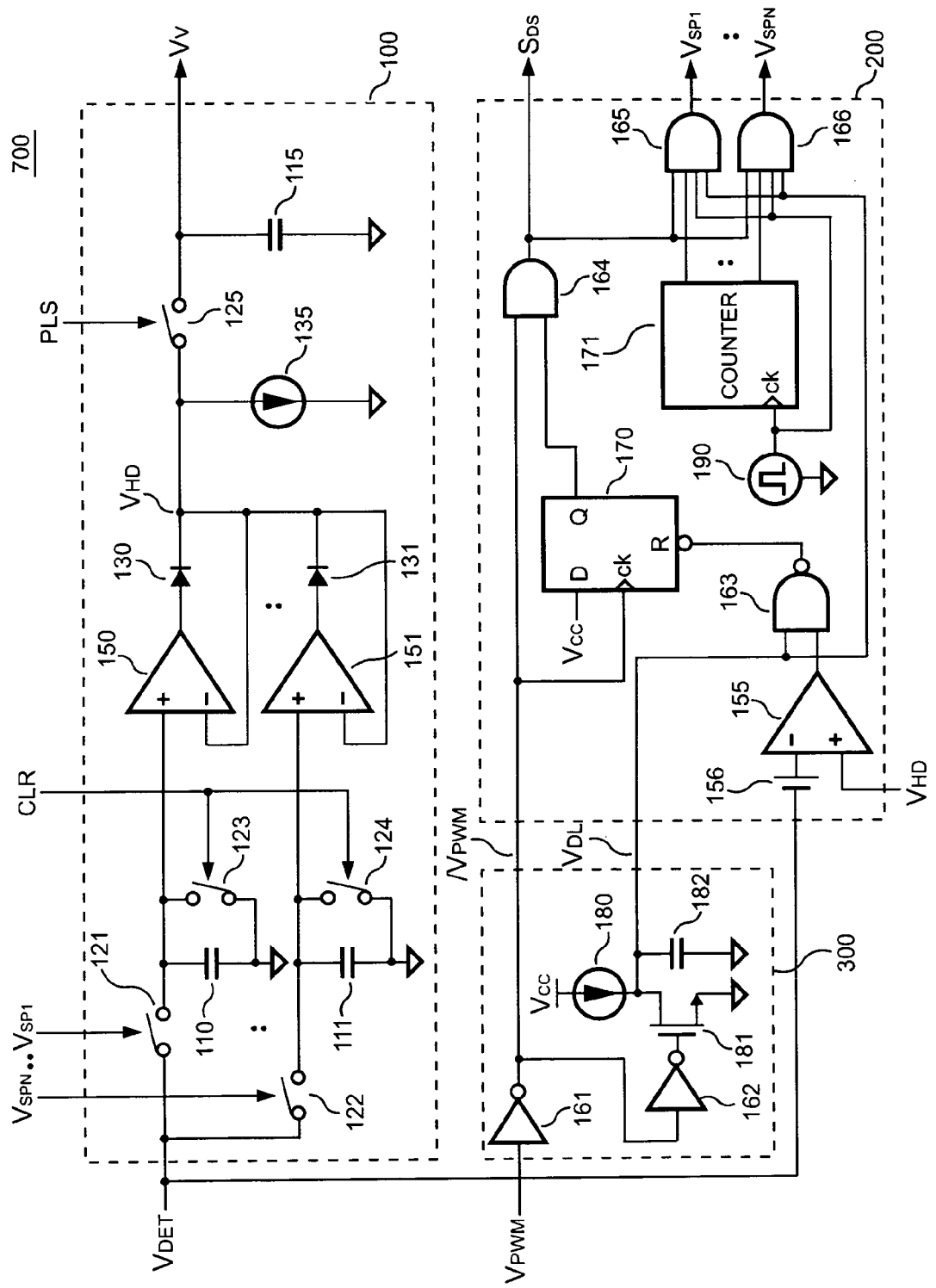
FIG. 5 shows the multi-sampling circuit according to an embodiment of the present invention.

Referring to FIG. 1 and FIG. 5, the multi-sampling circuit 700 according to an embodiment of the present invention is illustrated. The voltage-feedback signal $V_V$ and the discharge-time signal $S_{DS}$ are generated during a multi-sampling operation of the reflected voltage signal $V_{DET}$. The voltage-feedback signal $V_V$ is in precise proportion to the output voltage $V_O$. The discharge-time signal $S_{DS}$ represents the discharge time $T_{DS}$ of the secondary-side switching current $I_S$. Before the secondary-side switching current Is falls to zero, the reflected voltage signal $V_{DET}$ is sampled and measured. Therefore, the variation of the secondary-side switching current $I_S$ does not affect the forward voltage drop $V_F$ of the rectifier 40.

The signal-generating unit 200 includes a first signal generator, a second signal generator, a threshold signal 156, and a pulse generator 190. The pulse generator 190 generates a sampling-pulse signal for the multi-sampling operation. The threshold signal 156 added to the reflected voltage signal $V_{DET}$ generates a level-shift reflected signal. The first signal generator includes a counter 171, an AND gate 165, and an AND gate 166 for generating sampling signals $V_{SPN} \ldots V_{SP1}$. The second signal generator includes a D flip-flop 170, an NAND gate 163, an AND gate 164 and a comparator 155 for generating the discharge-time signal $S_{DS}$.

Further referring to FIG. 5 and FIG. 6, the time-delay unit 300 includes an inverter 161, an inverter 162, a current source 180, a transistor 181, and a capacitor 182 for generating a delay time $T_d$ as the switching signal $V_{PWM}$ is disabled. An input of an inverter 161 is supplied with the switching signal $V_{PWM}$. An output of the inverter 161 is connected to an input of the inverter 162, a first input of the AND gate 164, and a clock-input of the D flip-flop 170. An output of the inverter 162 turns the transistor 181 on/off. The capacitor 182 is connected in parallel with the transistor 181. The current source 180 is applied to charge the capacitor 182. Therefore the current of the current source 180 and the capacitance of the capacitor 182 determine the delay time $T_d$ of the time-delay unit 300. The capacitor 182 further generates the delay-time signal $V_{DL}$.

A D-input of the D flip-flop 170 is pulled high by a supply voltage $V_{CC}$. An output of the D flip-flop 170 is connected to a second input of the AND gate 164. The AND gate 164 outputs the discharge-time signal $S_{DS}$. The discharge-time signal $S_{DS}$ is thus enabled as the switching signal $V_{PWM}$ is disabled. An output of the NAND gate 163 is connected to a reset-input of the D flip-flop 170. A first input of the NAND gate 163 is connected to the capacitor 182 for receiving the delay-time signal $V_{DL}$. A second input of the NAND gate 163 is connected to an output of the comparator 155. The level-shift reflected signal is supplied to a negative input of the comparator 155. A positive input of the comparator 155 is supplied with the buffer signal $V_{HD}$. Therefore, after the delay time $T_d$, the discharge-time signal $S_{DS}$ can be disabled once the level-shift reflected signal is lower than the buffer signal $V_{HD}$. Besides, the discharge-time signal $S_{DS}$ can also be disabled as the switching signal $V_{PWM}$ is enabled.

The sampling-pulse signal is supplied to a clock-input of the counter 171 and third inputs of AND gates 165 and 166. The outputs of the counter 171 are respectively connected to second inputs of AND gates 165 and 166. First inputs of AND gates 165 and 166 are supplied with the discharge-time signal $S_{DS}$. Fourth inputs of AND gates 165 and 166 are supplied with the delay-time signal $V_{DL}$. Therefore sampling signals $V_{SPN} \ldots V_{SP1}$ are sequentially generated in response to the sampling-pulse signal. Besides, sampling signals $V_{SPN} \ldots V_{SP1}$ are sequentially produced during an enabled period of the discharge-time signal $S_{DS}$. However, the delay time $T_d$ is inserted at the beginning of the discharge-time signal $S_{DS}$ to prevent sampling signals $V_{SPN} \ldots V_{SP1}$. Sampling signals $V_{SPN} \ldots V_{SP1}$ are thus disabled during the delay time $T_d$.

Sampling signals $V_{SPN} \ldots V_{SP1}$ are used for sequentially sampling the reflected voltage signal $V_{DET}$. Sampling signals $V_{SPN} \ldots V_{SP1}$ control switches such as 121 . . . 122 for obtaining hold voltages across hold capacitors such as 110 . . . 111, respectively. A switch 123 is connected in parallel with the capacitor 110 to discharge the capacitor 110. A switch 124 is connected in parallel with the capacitor 111 to discharge the capacitor 111.

A buffer circuit of the sampling unit 100 includes a plurality of operational amplifiers such as 150 . . . 151, diodes 130 . . . 131, and a current source 135 for generating the buffer signal $V_{HD}$. The positive inputs of the operational amplifiers 150 . . . 151 are connected to the hold capacitors 110 . . . 111, respectively. The negative inputs of the operational amplifiers 150 . . . 151 are connected to an output of the buffer circuit.

The diode 130 is connected from an output of the operational amplifier 150 to the output of the buffer circuit. The diode 131 is connected from an output of the operational amplifier 151 to the output of the buffer circuit. The buffer signal $V_{HD}$ is thus obtained from the higher voltage of hold voltages. The current source 135 is used for termination. A switch 125, which is turned on/off by the pulse signal PLS, is connected to the buffer circuit. The switch 125 periodically conducts the buffer signal $V_{HD}$ to a capacitor 115 for producing the voltage-feedback signal $V_V$. Therefore the voltage-feedback signal $V_V$ is proportional to the output voltage $V_O$ of the switching circuit. Sampling signals $V_{SPN} \ldots V_{SP1}$ start to produce hold voltages after the delay time $T_d$, thus the spike interference of the voltage signal $V_{AUX}$ is avoided. The spike of the voltage signal $V_{AUX}$ would be generated when the switching signal $V_{PWM}$ is disabled and the transistor 20 is turned off.

Referring to FIG. 6, the voltage signal $V_{AUX}$ starts to decrease as the secondary-side switching current $I_S$ falls to zero, which is then detected by the comparator 155 for disabling the discharge-time signal $S_{DS}$. The pulse width of the discharge-time signal $S_{DS}$ is therefore correlated to the discharge time $T_{DS}$ of the secondary-side switching current $I_s$. Meanwhile, sampling signals $V_{SPN} \ldots V_{SP1}$ are disabled and the multi-sampling operation is stopped as the discharge-time signal $S_{DS}$ is disabled. At the moment, the buffer signal $V_{HD}$ generated at the output of the buffer circuit represents an end voltage. The end voltage is thus correlated to the voltage signal $V_{AUX}$ sampled, once the secondary-side switching current $I_S$ falls to zero. The buffer signal $V_{HD}$ is obtained from the higher voltage of hold voltages, which ignores the voltage sampled when the voltage signal $V_{AUX}$ has started to decrease.

Besides, once the switching signal $V_{PWM}$ is enabled, a minimum of the on-time $T_{ON}$ of the switching signal $V_{PWM}$ is ensured. The minimum of the on-time $T_{ON}$ of the switching signal $V_{PWM}$ further ensures a minimum of the discharge time $T_{DS}$, which ensures a proper multi-sampling operation for sampling the voltage signal $V_{AUX}$ in the multi-sampling circuit 700. The discharge time $T_{DS}$ is related to the on-time $T_{ON}$ of the switching signal $V_{PWM}$. Referring to equations (1), (2), and (3) and the secondary inductance $L_S$, which is given by equation (9), the discharge time $T_{DS}$ can be expressed by equation (10).

$$L_S = \left(\frac{T_{NS}}{T_{NP}}\right)^2 \times L_P \qquad (9)$$

$$T_{DS} = \left(\frac{V_{IN}}{V_O + V_F}\right) \times \frac{T_{NS}}{T_{NP}} \times T_{ON} \qquad (10)$$

Figure 7:
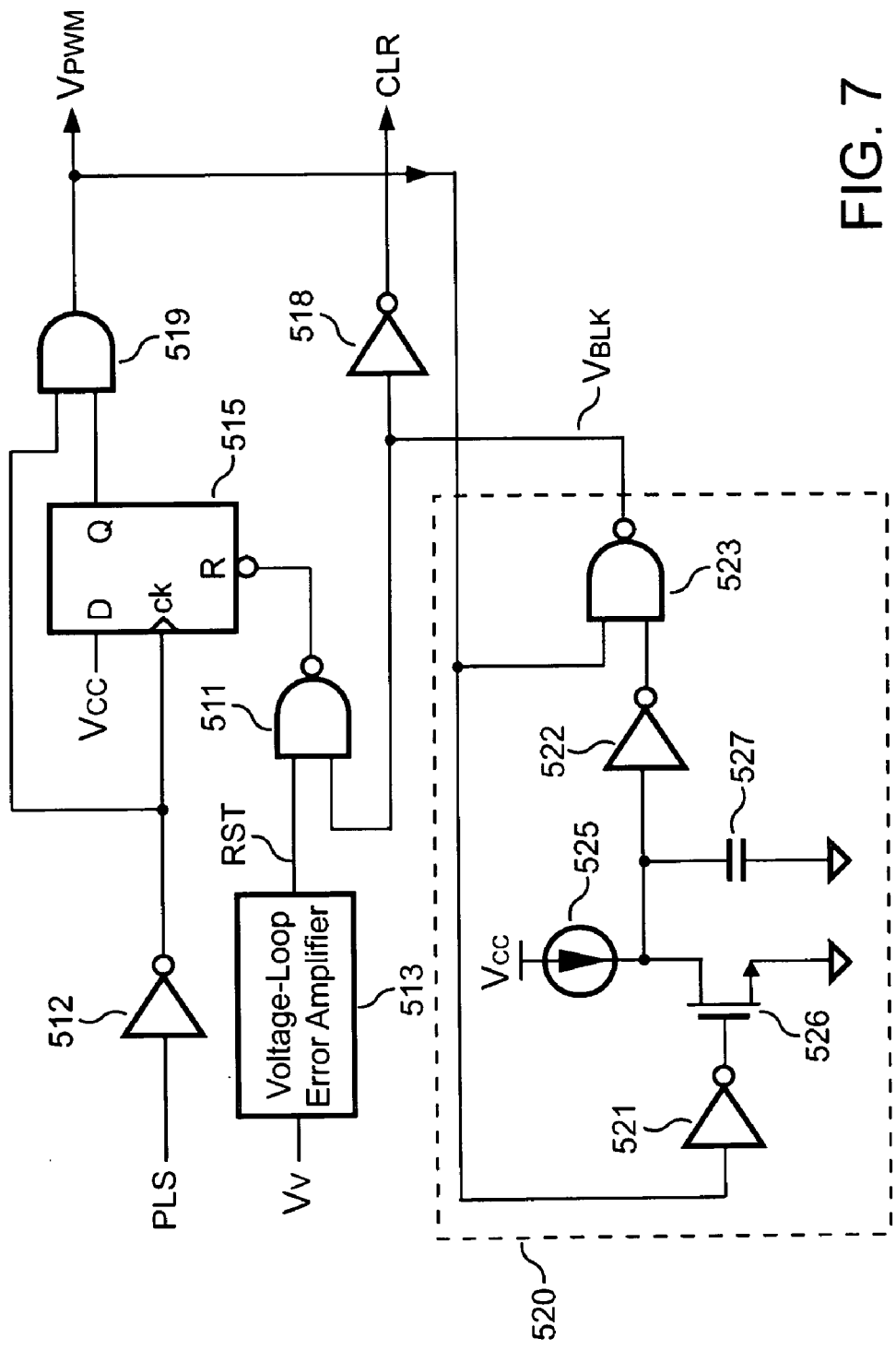
FIG. 7 shows a PWM-and-blanking unit according to an embodiment of the present invention.

FIG. 7 shows the PWM-and-blanking unit 500 according to an embodiment of the present invention. The PWM-and-blanking unit 500 includes a PWM circuit and a blanking circuit 520. The PWM circuit comprises an NAND gate 511, a D flip-flop 515, an AND gate 519, an inverter 512, an inverter 518, and a voltage-loop error amplifier 513. Referring to FIG. 4 and FIG. 6, the inverter 512 is connected to the oscillating unit 600 for receiving the pulse signal PLS. An output of the inverter 512 is connected to a clock-input of the D flip-flop 515 for enabling the switching signal $V_{PWM}$. A D-input of the D flip-flop 515 is pulled high by the supply voltage $V_{CC}$. An output of the D flip-flop 515 is connected to a first input of the AND gate 519. A second input of the AND gate 519 is connected to the output of the inverter 512. The switching signal $V_{PWM}$ is generated by the AND gate 519. A reset input of the D flip-flop 515 is connected to an output of the NAND gate 511. A first input of the NAND gate 511 is supplied with a reset signal RST to turn off the switching signal $V_{PWM}$ cycle by cycle. The voltage-loop error amplifier 513 generates the reset signal RST in response to the voltage-feedback signal $V_V$. A second input of the NAND gate 511 is connected to an output of the blanking circuit 520 for receiving a blanking signal $V_{BLK}$.

Referring to FIG. 7, the blanking circuit 520 includes NAND gate 523, a current source 525, a transistor 526, an inverter 521, a capacitor 527, and an inverter 522. The switching signal $V_{PWM}$ supplies an input of the inverter 521 and a first input of the NAND gate 523. An output of the inverter 521 turns the transistor 526 on/off. An output of the inverter 522 is connected to a second input of the NAND gate 523. A current of the current source 525 and a capacitance of the capacitor 527 determine the pulse width of the blanking signal $V_{BLK}$. The inverter 518 receives the blanking signal $V_{BLK}$ and generates the clear signal CLR. Referring to FIG. 6, the clear signal CLR and the blanking signal $V_{BLK}$ are reciprocally inversed. The clear signal CLR turns the switches 123 and 124 on/off. As the switching signal $V_{PWM}$ is enabled, the blanking circuit 520 outputs the blanking signal $V_{BLK}$ to disable the $V_{PWM}$ to avoid the D flip-flop 515 from being reset.

Since the voltage signal $V_{AUX}$ is reflected from the transformer 10 as the switching signal $V_{PWM}$ is off, the switching signal $V_{PWM}$ must maintain a minimum switching frequency to ensure a switching of the transformer 10 for multi-sampling the voltage signal $V_{AUX}$.

Figure 8:
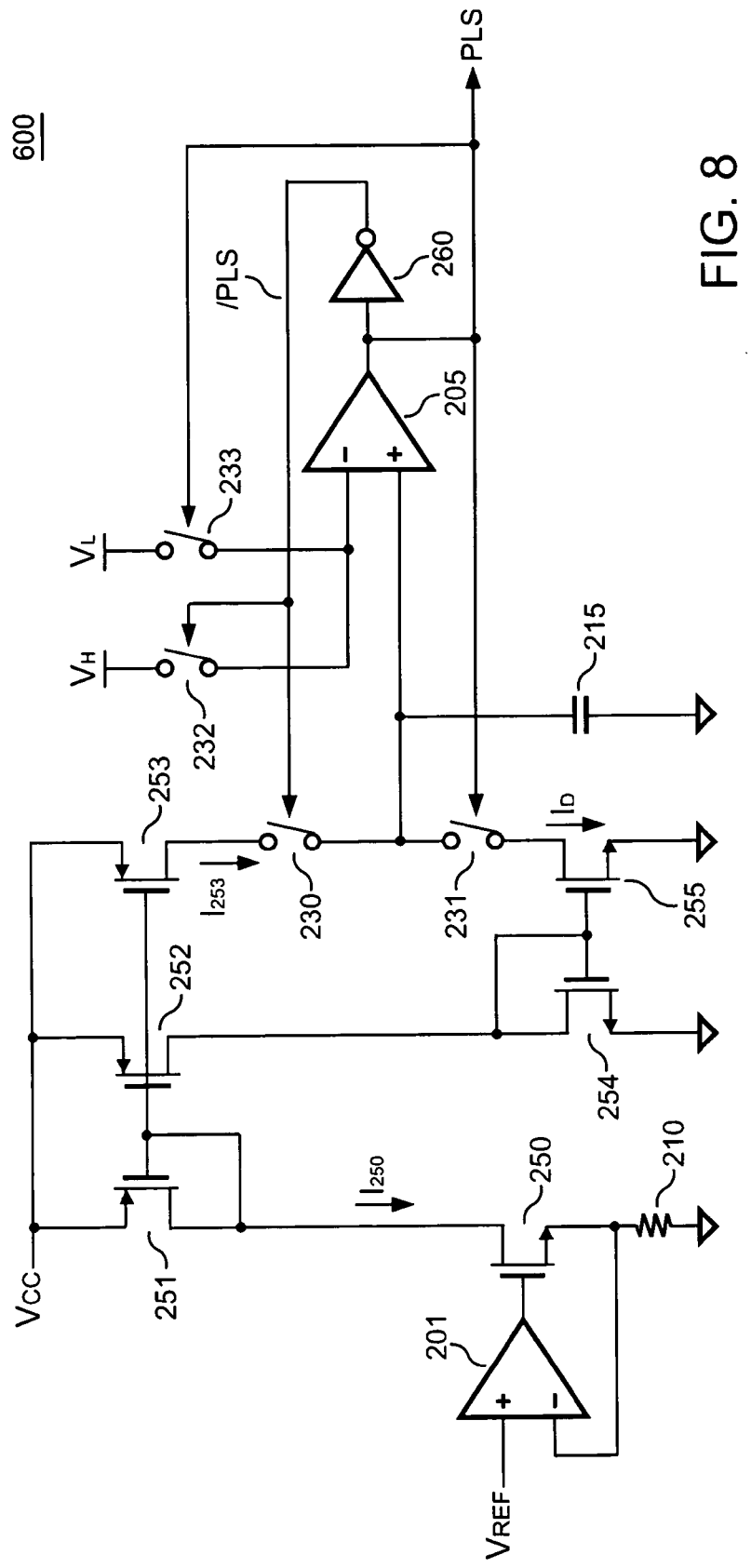
FIG. 8 shows an oscillating unit according to an embodiment of the present invention.

FIG. 8 shows the oscillating unit 600 according to an embodiment of the present invention. An operational amplifier 201, a resistor 210, and a transistor 250 form a first V-to-I converter. The first V-to-I converter generates a reference current $I_{250}$ in response to a reference voltage $V_{REF}$. A plurality of transistors, such as 251, 252, 253, 254, and 255 form current mirrors to generate a charge current $I_{253}$ and a discharge current $I_D$ in response to the reference current $I_{250}$. A first switch 230 is connected between a drain of the transistor 253 and a capacitor 215. A second switch 231 is connected between the capacitor 215 and a drain of the transistor 255. A first comparator 205 generates the pulse signal PLS for determining the switching frequency. A first terminal of a third switch 232 is supplied with a high-threshold voltage $V_H$. A first terminal of a fourth switch 233 is supplied with a low-threshold voltage $V_L$. A second terminal of the third switch 232 and a second terminal of the fourth switch 233 are connected to a negative terminal of the comparator 205. An input of an inverter 260 is connected to an output of the comparator 205. An output of the inverter 260 generates an inverse pulse signal/PLS. The pulse signal PLS turns the second switch 231 and the fourth switch 233 on/off. The inverse pulse signal/PLS turns the first switch 230 and the third switch 232 on/off.

As described above, the present invention provides a precise multi-sampling circuit in a switching controller for power converters. The multi-sampling circuit is capable of measuring the voltage signal and the discharge time of the transformer without having the optical-coupler and the secondary-side regulator to regulate output voltage and output current of the power converter.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A sampling circuit for receiving a reflected voltage signal from an auxiliary winding of a transformer; said sampling circuit comprising:

a time-delay unit, coupled to receive a switching signal for generating a delay-time signal as said switching signal is disabled, wherein said switching signal is used to switch said transformer via a switch;

a signal-generating unit, coupled to receive said delay-time signal, said switching signal, and said reflected voltage signal for generating a discharge-time signal and sampling signals; wherein said sampling signals are sequentially generated;

a sampling unit, coupled to receive said sampling signals for sampling said reflected voltage signal to hold capacitors respectively; wherein said hold capacitors generate hold voltages;

a buffer circuit, coupled to said hold capacitors for obtaining a higher voltage of hold voltages to be a buffer signal; and a comparison circuit, coupled to said buffer circuit to compare said buffer signal with a level-shift signal for generating a stop signal; wherein said level-shift signal is resulted from by adding a threshold signal with said reflected voltage signal; said stop signal is enabled once said level-shift signal is lower than said buffer signal;

wherein said discharge-time signal is enabled as said switching signal is disabled; said stop signal disabling said discharge-time signal; a pulse width of said discharge-time signal being correlated to a discharge time of said transformer; said sampling signals starting to generate after an end of said time-delay signal; said stop signal terminating said sampling signals; a feedback signal being generated in accordance with said buffer signal after said stop signal being generated; wherein said feedback signal is corrected to an output voltage of said transformer.

2. The sampling circuit as claimed in claim 1, wherein said signal-generating unit comprises:

a sampling-pulse generator, generating a sampling-pulse signal periodically for multi-sampling operation;

a first signal generator, sequentially generating said sampling signals in response to said sampling-pulse signal during an enabled period of said discharge-time signal; wherein a delay time is inserted at a beginning of said discharge-time signal; wherein said sampling signals are disabled during a period of said delay time; and a second signal generator, for generating said discharge-time signal; wherein said discharge-time signal is enabled as said switching signal is disabled; wherein said discharge-time signal is disabled as said stop signal is generated; said discharge-time signal being disabled as said switching signal being enabled.

3. The sampling circuit as claimed in claim 1, wherein said sampling unit further comprises a sampling switch connected to said buffer circuit, said sampling switch being cycle-by-cycle controlled by a pulse signal to conduct said buffer signal to an output capacitor for generating said feedback signal; wherein said switching signal is correlated to said pulse signal.

4. The sampling circuit as claimed in claim 1, wherein multi-sampling said reflected voltage signal generates said feedback signal, said feedback signal being measured once a secondary-side switching current of said transformer falling to zero.

5. The sampling circuit as claimed in claim 1, wherein said switching signal has a minimum on-time, wherein once said switching signal is enabled, said minimum on-time ensures a minimum discharge time for multi-sampling operation of said reflected voltage signal.

6. The sampling circuit as claimed in claim 1, wherein said switching signal has a minimum switching frequency to ensure a switching of said transformer for multi-sampling operation of said reflected voltage signal.

7. A multi-sampling circuit for receiving a reflected voltage signal from a winding of a transformer; said multi-sampling circuit comprising:

a signal generator, coupled to receive a switching signal and said reflected voltage signal for generating a discharge-time signal and sampling signals, said sampling signals being sequentially generated as said switching signal being disabled; wherein said switching signal is used for switching said transformer via a switch;

a sample-hold circuit, coupled to receive said sampling signals for sampling said reflected voltage signal to hold capacitors respectively; wherein said hold capacitors generate hold voltages in response to the sampling operation of the sampling signals;

a buffer circuit, coupled to generate a buffer signal in accordance with a higher voltage of said hold voltages; and a comparison circuit, coupled to generate a stop signal by comparing said buffer signal with a level-shift signal; wherein said level-shift signal is resulted from adding said reflected voltage signal with a threshold signal; said stop signal being enabled once said level-shift signal being lower than said buffer signal;

wherein said discharge-time signal is enabled as said switching signal is disabled; said stop signal disabling said discharge-time signal; a pulse width of said discharge-time signal being correlated to a discharge time of said transformer; wherein a feedback signal is generated in accordance with said buffer signal after said stop signal being generated; said stop signal terminating said sampling signals; said feedback signal being correlated to an output voltage of said transformer.

8. The multi-sampling circuit as claimed in claim 7, wherein said signal generator comprises:

a sampling-pulse generator, generating a sampling-pulse signal periodically for multi-sampling operation;

a first signal generator, sequentially generating sampling signals in response to said sampling-pulse signal during an enabled period of said discharge-time signal; wherein a delay time is inserted at a beginning of said discharge-time signal; and said sampling signals are disabled during a period of said delay time; and a second signal generator, for generating said discharge-time signal; wherein said discharge-time signal is enabled once said switching signal is disabled; said discharge-time signal being disabled once said stop signal being generated; said discharge-time signal being disabled as said switching signal being enabled.

9. The multi-sampling circuit as claimed in claim 7, wherein said sample-hold circuit comprises a sampling switch connected to said buffer circuit, said sampling switch being cycle-by-cycle controlled by a pulse signal to conduct said buffer signal to an output capacitor for generating a feedback signal; wherein said switching signal is correlated to said pulse signal.

10. The multi-sampling circuit as claimed in claim 7, wherein multi-sampling said reflected voltage signal generates said feedback signal, said feedback signal being measured once a secondary-side switching current of said transformer falling to zero.

11. The multi-sampling circuit as claimed in claim 7, wherein said switching signal has a minimum on-time, wherein once said switching signal is enabled, said minimum on-time ensures a minimum discharge time for multi-sampling operation of said reflected voltage signal.

12. The multi-sampling circuit as claimed in claim 7, wherein said switching signal has a minimum switching frequency to ensure a switching of said transformer for multi-sampling operation of said reflected voltage signal.

13. A multi-sampling circuit, for receiving a reflected voltage signal from a transformer; said multi-sampling circuit comprising:

a signal generator, coupled to receive a switching signal and said reflected voltage signal for generating sampling signals sequentially, said sampling signals being generated as said switching signal being disabled; wherein said switching signal is used for switching said transformer;

a sample-hold circuit, coupled to receive said sampling signals for sampling said reflected voltage signal to hold capacitors respectively; wherein said hold capacitors generate hold voltages;

a buffer circuit, coupled to generate a buffer signal from a higher voltage of said hold voltages; and a comparison circuit, coupled to generate a stop signal by comparing said buffer signal with a level-shift signal; wherein said level-shift signal is resulted from adding said reflected voltage with a threshold signal; said stop signal being generated once said level-shift signal being lower than said buffer signal;

wherein a feedback signal is generated in accordance with said buffer signal once said stop signal is generated; said stop signal terminating said sampling signals; said feedback signal being correlated to an output voltage of said transformer.

14. The multi-sampling circuit as claimed in claim 13, wherein multi-sampling said reflected voltage signal generates said feedback signal, and said feedback signal being measured once a secondary-side switching current of said transformer falling to zero.

15. The multi-sampling circuit as claimed in claim 13, wherein said switching signal has a minimum on-time, wherein once said switching signal is enabled, said minimum on-time ensures a minimum discharge time for multi-sampling operation of said reflected voltage signal.

* * * * *